(12) United States Patent
Maryan et al.

(10) Patent No.: US 9,257,164 B2
(45) Date of Patent: Feb. 9, 2016

(54) CIRCUITS AND METHODS FOR DQS AUTOGATING

(71) Applicant: Altera Corporation, San Jose, CA (US)

(72) Inventors: Krzysztof Maryan, Toronto (CA); Gordon Raymond Chiu, North York (CA); Warren Nordyke, Cupertino, CA (US); Navid Azizi, Markham (CA)

(73) Assignee: Altera Corporation, San Jose, CA (US)

( * ) Notice: Subject to any disclaimer, the term of this patent is extended or adjusted under 35 U.S.C. 154(b) by 227 days.

(21) Appl. No.: 13/829,881

(22) Filed: Mar. 14, 2013

(65) Prior Publication Data

US 2014/0269117 A1    Sep. 18, 2014

(51) Int. Cl.
*G11C 7/10* (2006.01)
*G11C 29/02* (2006.01)
*G11C 8/18* (2006.01)

(52) U.S. Cl.
CPC ............... *G11C 8/18* (2013.01); *G11C 7/1087* (2013.01); *G11C 7/1093* (2013.01); *G11C 29/023* (2013.01)

(58) Field of Classification Search
CPC ..... G11C 7/222; G11C 7/1078; G11C 7/1093
USPC .......................................... 365/193; 713/400
See application file for complete search history.

(56) References Cited

U.S. PATENT DOCUMENTS

| | | | | |
|---|---|---|---|---|
| 6,543,017 B1* | 4/2003 | Arai | ...................... | G11C 7/1006 365/201 |
| 2006/0193188 A1* | 8/2006 | Smela et al. | .................. | 365/221 |
| 2008/0031079 A1* | 2/2008 | Osawa | ...................... | G11C 8/08 365/233.1 |
| 2008/0126822 A1* | 5/2008 | Kim | ...................... | G11C 7/1078 713/500 |
| 2009/0034344 A1* | 2/2009 | Nguyen | ............... | G11C 7/1018 365/189.07 |
| 2009/0161453 A1* | 6/2009 | Giovannini et al. | .......... | 365/193 |
| 2010/0118627 A1* | 5/2010 | Best | ..................... | G06F 13/1689 365/193 |
| 2011/0205832 A1* | 8/2011 | Jeon | ..................... | G11C 7/1057 365/233.16 |
| 2013/0290766 A1* | 10/2013 | Nguyen | .................... | G06F 1/12 713/400 |
| 2014/0016404 A1* | 1/2014 | Kim | ..................... | G11C 11/165 365/158 |
| 2015/0098277 A1* | 4/2015 | Lin | ........................ | G11C 7/222 365/189.02 |

* cited by examiner

*Primary Examiner* — Hoai V Ho
*Assistant Examiner* — Roberto Mancera
(74) *Attorney, Agent, or Firm* — Weaver Austin Villeneuve & Sampson LLP

(57) ABSTRACT

In one aspect, a method includes receiving a differential strobe signal including first and second components; buffering, by a first buffer, both the first and second components; and buffering, by a second buffer, the first component. The method includes receiving, by a control logic block, the output of the second buffer. The method includes, after a period when the values of both the first and second components are at a first logic state, but before receiving a burst of clock edges in the differential strobe signal, detecting a transition in the first component from the first logic state to a second logic state, and in response to the detected transition, asserting an enable signal. The method further includes receiving, by a gating logic block, the enable signal and the output of the first buffer, and, when the enable signal is asserted, un-gating the output of the first buffer.

23 Claims, 8 Drawing Sheets

CIRCUITS AND METHODS FOR DQS AUTOGATING

TECHNICAL FIELD

This disclosure relates generally to transferring data between devices utilizing a DQS or other clock burst system architecture, and more specifically, to circuits and methods for automatically gating and un-gating a strobe signal transmitted with a data signal such that the data bits in the data signal are properly captured using the strobe signal.

DESCRIPTION OF RELATED TECHNOLOGY

Integrated circuits include microprocessors (or "cores"), programmable logic devices (PLDs) such as field-programmable gate arrays (FPGAs), application-specific integrated circuits (ASICs), digital memory controllers, and digital memory chips, for example, and can be found in a wide assortment of devices, systems, and applications such as in computers, mobile phones, multimedia devices, automobiles, and many household and commercial appliances. An IC is often soldered or otherwise electrically connected with a circuit board or other intermediary that generally includes or is connected to one or more power supplies capable of supplying power to the IC. In many applications, an IC is configured to communicate data with an external memory device, which may be located on the same circuit board. For example, an IC, such as an FPGA, can be configured to communicate with a random access memory (RAM) device. In such cases, the IC and the external memory device may communicate according to the DQS system architecture. In such a communication system, the IC and the external memory device are configured to communicate short bursts of data bits, referred to as DQ data signals, over a bi-directional DQ channel that connects the devices. In order for the receiving one of the devices to properly capture the data in a DQ data signal, the transmitting one of the devices also commensurately transmits a DQS strobe signal containing corresponding bursts of clock edges along a separate bi-directional DQS channel. The receiving device uses the clock edges of the DQS strobe signal to sample and latch the data bits in the DQ data signal.

As the frequencies involved in communicating the DQ and DQS signals have increased, for example to more than 1 Giga-Hertz (GHz), it has generally become increasingly difficult to properly align the edges of the DQS signal with the data bits in the DQ signal while not inadvertently sampling unusable portions of the DQ signal and while also not failing to sample all of the desired bits transmitted in the DQ signal. Some traditional approaches involve gating the input received over the DQS channel such that only when the DQS channel is un-gated, does the receiving device pass (or "un-gate") the input. When the DQS channel is un-gated, the receiving device can receive the DQS signal over the DQS channel from the transmitting device and use the DQS signal to recover the data transmitted in the DQ signal (hereinafter "recover," "capture," "sample," and "latch" may be used interchangeably). To avoid inadvertent data capture, it is generally desirable that the DQS channel is un-gated immediately prior to, or within a short time frame prior to, when the receiving device actually receives the DQS signal. The gating process has traditionally been a timing critical path and typically involves counting clock cycles to determine when to gate and un-gate the DQS channel. This traditional technique for gating and un-gating also requires a sufficiently long "preamble" period in which the value of the DQS signal is fixed and unchanging. The length of the preamble period also can serve as a factor limiting the achievable average data transfer rates between the devices.

SUMMARY

This disclosure relates generally to transferring data between devices utilizing a DQS system architecture, and more specifically, to circuits and methods for automatically gating and un-gating a DQS strobe signal transmitted with a DQ data signal such that the data bits in the DQ data signal are properly captured with the DQS strobe signal.

In one aspect of the subject matter disclosed, a method includes receiving, by a configurable circuit, a differential strobe signal comprised of a first component and a second component. The method also includes buffering, by a first buffer, both the first component and the second component of the differential strobe signal. The method also includes buffering, by a second buffer, the first component of the differential strobe signal. The method also includes receiving, by a control logic block, the output of the second buffer, and, after a period when the values of both the first component and the second component of the differential strobe signal are at a first logic state, but before receiving a burst of clock edges in the differential strobe signal, detecting, by the control logic block, a transition in the first component of the differential strobe signal from the first logic state to a second logic state. The method also includes, in response to the detection of the transition, asserting, by the control logic block, an enable signal. The method additionally includes, receiving, by a gating logic block, the enable signal and the output of the first buffer. The method further includes, when the enable signal is asserted, un-gating, by the gating logic block, the output of the first buffer such that the output of the first buffer is passed through the gating logic block.

In some implementations, the method further includes receiving a data signal approximately commensurately in parallel with the burst of clock edges in the differential strobe signal. In some implementations, the method further includes delaying the output of the gating logic block such that the clock edges in the output of the gating logic block are approximately aligned with the centers of data bits in the data signal. In some such implementations, the method further includes sampling the data bits in the data signal at the clock edges. In some implementations, the method further includes, after a number of clock edges in the differential strobe signal are received, de-asserting, by the control logic block, the enable signal. In some such implementations, the method further includes, when the enable signal is de-asserted, gating, by the gating logic block, the output of the first buffer such that the output of the first buffer is not passed through the gating logic block and such that the output of the gating logic block is fixed. In some implementations, the data signal is a DQ signal and the differential strobe signal is a DQS signal. In some implementations, the method is performed in a receiving circuit of a controller configured to communicate with a DDR4 SDRAM.

In another aspect of the subject matter disclosed, a method includes receiving, by one or more buffers, a differential strobe signal comprised of a first component and a second component, the differential strobe signal being characterized by at least three states including a tri-state, a preamble state, and a burst state. The tri-state is characterized by a state in which both the first component and the second component of the differential strobe signal have values at a first logic state. The preamble state is characterized by a first time period in which the first component is at the first logic state and the second component is at a second logic state, a transition period in which the value of the first component transitions from the first logic state to the second logic state, and a second time period in which the first component is at the second logic state and the second component is at a first logic state. The burst state is characterized by a number of cycling clock edges. The method includes detecting, during the preamble, by a control logic block, the transition of the first component from the first logic state to the second logic state. The method additionally includes, in response to the detection of the transition, asserting, by the control logic block, an enable signal. The method further includes receiving, by a gating logic block, the enable signal and the differential strobe signal, and when the enable signal is asserted, un-gating, by the gating logic block, the differential strobe signal such that the clock edges in the burst state are passed through the gating logic block.

In some implementations, the method further includes receiving a data signal approximately commensurately in parallel with the clock edges in the differential strobe signal while in the burst state. In some implementations, the method further includes delaying the output of the gating logic block such that the clock edges in the delayed differential strobe while in the burst state signal are approximately aligned with the centers of data bits in the data signal. In some such implementations, the method further includes sampling the data bits in the data signal at the clock edges. In some implementations, the method further includes, after a number of clock edges in the differential strobe signal are received, de-asserting, by the control logic block, the enable signal. In some such implementations, the method further includes, when the enable signal is de-asserted, gating, by the gating logic block, the differential strobe signal such that the clock edges in the burst state are not passed through the gating logic block and such that the output of the gating logic block is fixed. In some implementations, the data signal is a DQ signal and the differential strobe signal is a DQS signal. In some implementations, the method is performed in a receiving circuit of a controller configured to communicate with a DDR4 SDRAM.

In another aspect of the subject matter disclosed, a circuit includes a differential buffer configured to receive first and second components of a differential strobe signal and to output buffered first and second components of the differential strobe signal. The circuit includes a single-ended buffer configured to receive the first component of the differential strobe signal and to output a buffered first component of the differential strobe signal. the circuit includes a control logic block configured to receive the output of the single-ended buffer, the control block being further configured to detect a transition in the first component of the differential strobe signal and to assert an enable signal when the first component of the differential strobe signal transitions from a first logic state to a second logic state after a period when the values of both the first component and the second component of the differential strobe signal are at the first logic state, but before receiving a burst of clock edges in the differential strobe signal. The circuit additionally includes a gating logic block configured to receive the enable signal and the output of the differential buffer, the gating logic block being further configured to, when the enable signal is asserted, un-gate the output of the differential buffer such that the output of the differential buffer is passed through the gating logic block.

In some implementations, the circuit further includes a data buffer configured to receive a data signal approximately commensurately in parallel with the burst of clock edges in the differential strobe signal. In some implementations, the circuit further includes a delay block configured to delay the output of the gating logic block such that the clock edges in the output of the gating logic block are approximately aligned with the centers of data bits in the data signal. In some such implementations, the circuit further includes a latching circuit configured to sample the data bits in the data signal at the clock edges. In some implementations, after a number of clock edges in the differential strobe signal are received, the control logic block is configured to de-assert the enable signal. In some implementations, when the enable signal is de-asserted, the gating logic block is configured to gate the output of the differential buffer such that the output of the differential buffer is not passed through the gating logic block and such that the output of the gating logic block is fixed. In some implementations, the data signal is a DQ signal and the differential strobe signal is a DQS signal. In some implementations, the circuit is located within a receiving circuit of a controller configured to communicate with a DDR4 SDRAM. In some implementations, the circuit is implemented within a programmable logic device.

These and other aspects are described further below with reference to the drawings.

DETAILED DESCRIPTION

In the following description, numerous specific details are set forth in order to provide a thorough understanding of the presented implementations. The disclosed implementations may be practiced without some or all of these specific details. In other instances, well-known process operations have not been described in detail to not unnecessarily obscure the disclosed implementations. While the disclosed implementations will be described in conjunction with specific implementations, it will be understood that this is not intended to limit the disclosed implementations.

This disclosure provides examples of circuits and methods for automatically gating and un-gating a DQS strobe signal transmitted with a DQ data signal such that the data bits in the DQ data signal are properly captured with the DQS strobe signal. The circuits and methods described herein can be utilized in a variety of fields or applications. Generally, the circuits and methods are used in digital electronic devices or systems (hereinafter "devices" and "systems" may be used interchangeably) that utilize a DQS or other clock burst communication system architecture. For example, the circuits and methods can be used in systems that include integrated circuits (ICs) or memory controllers that are configured to interface with external memory devices or memory cards.

Figure 1:
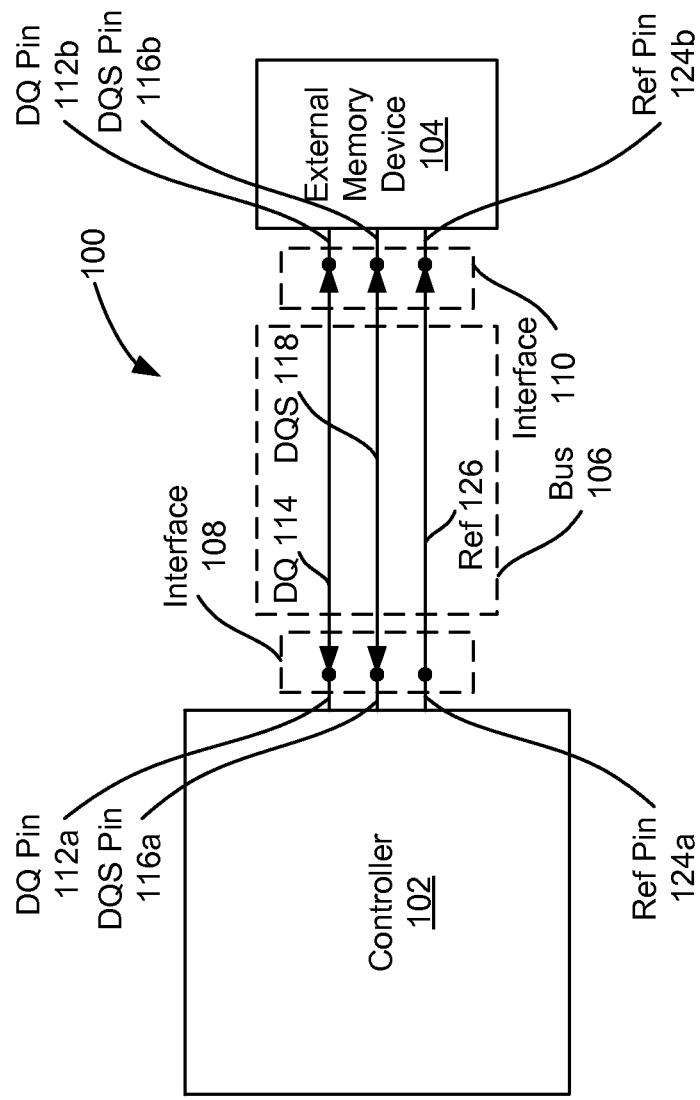
FIG. 1 shows an example system that includes a controller configured to communicate with an external memory device via a communication bus.

FIG. 1 shows an example system 100 that includes a controller 102 configured to communicate with an external memory device 104 via a communication bus 106. The controller 102 can be a digital circuit such as a memory controller or a more complex circuit such as an integrated circuit (IC). In some implementations, the controller 102 can be a configurable circuit such as a programmable logic device (PLD). For example, the controller 102 can be a complex programmable logic device (CPLD) or a field-programmable gate array (FPGA). In some other implementations, the controller 102 can be a different type of configurable circuit, such as a configurable application specific IC (ASIC) or a structured ASIC. In some implementations, the external memory device 104 utilizes random access memory (RAM), which can be in the form of a discrete component located on the same circuit board. In some other implementations, the RAM can be on a standardized separate board module, such as a dual in-line memory module (DIMM), as is typical in personal computers. For example, the external memory device 104 can utilize a dynamic RAM (DRAM), and more specifically, a synchronous DRAM (SDRAM), and even more specifically, a double data rate (DDR) SDRAM. The disclosed implementations are primarily directed to an external memory device 104 that uses pseudo open drain (POD) technology, and more particularly, devices that conform to the POD12-1.2 V pseudo open drain interface JEDEC standard. In a particular implementation, the controller 102 is, or is included within, an FPGA that is configured to communicate with an external memory device 104 that utilizes fourth generation DDR (DDR4) SDRAM. However, various implementations can generally be configured to work with devices that conform to an IO standard in which the DQS or other strobe signal has a deterministic tri-state as opposed to an indeterminate tri-state.

The controller 102 is configured to communicate with the external memory device 104 over a bus 106. In some implementations, the bus 106 is a bi-directional bus that utilizes the DQS communication system architecture. The bus 106 enables communication between a controller-side interface 108 and a memory-side interface 110. In some implementations, the controller-side interface 108 is on the same chip or die as the controller 102. Similarly, in some implementations, the memory-side interface 110 is on the same chip or die as the external memory device 104. In a DQS system architecture, each of the controller 102 and the external memory device 104 includes a transmitting circuit ("transmitter) and a receiving circuit ("receiver") (both not shown) that communicate via the bus 106. Each of the controller 102 and the external memory device 104 includes one or more data pins, referred to herein collectively as the DQ pin, that can enable parallel transfer of data. For example, in some DDR4 systems, there are typically four or eight DQ pins for every DQS pin. The controller 102 and the external memory device 104 transmit and receive data signals over their respective DQ pins 112a and 112b, respectively. The bus 106, in conjunction with memory interfaces 108 and 110, links the DQ pin 112a of the controller 102 with the DQ pin 112b of the external memory device 104 to form a DQ channel 114. The DQ channel 114 enables bi-directional communication of data signals between the controller 102 and the external memory device 104. As just described, each of the DQ pins of the controller 102 and the external memory device 104 can typically include four or eight physical pins, thus, the DQ channel 114 can typically include four or eight physical channels— each channel connected a DQ pin of the controller 102 with a DQ pin of the external memory device 104.

Each of the controller 102 and the external memory device 104 also includes a clock pin, referred to as the DQS pin. The controller 102 and the external memory device 104 transmit and receive clock signals over their respective DQS pins 116a and 116b, respectively. The bus 106, in conjunction with memory interfaces 108 and 110, links the DQS pin 116a of the controller 102 with the DQS pin 116b of the external memory device 104 to form a DQS channel 118. The DQS channel 118 enables bi-directional communication of clock signals, referred to as DQ strobe (DQS) signals. A DQS signal is generally a short burst of a clock signal transmitted over a DQS channel commensurately with a short burst of data being communicated along a DQ channel. In various implementations, the DQS signal is a differential signal having complimentary first and second components. As such, the DQS channel 118 actually refers to two physical channels, one for carrying the first component of the differential DQS signal and one for carrying the second (generally complimentary) component of the differential DQS signal. Similarly, each of the DQS pins 116a and 116b actually refers to a pair of I/O pins, one for transmitting and receiving the first component of a DQS signal and one for transmitting and receiving the second component of the DQS signal.

In some implementations, the controller 102 also transmits a reference clock signal to the external memory device 104. For example, the controller 102 may continuously transmit the reference clock signal to the external memory device 104. To enable this functionality, each of the controller 102 and the external memory device 104 can further include additional reference clock pins 124a and 124b (hereinafter "Ref pin 124a" and "Ref pin 124b"), respectively. The bus 106, in conjunction with memory interfaces 108 and 110, links the Ref pin 124a of the controller 102 with the Ref pin 124b of the external memory device 104 to form a Ref channel 126. In some implementations, the Ref channel 126 enables uni-directional communication of a reference clock signal from the controller 102 to the external memory device 104. In some implementations, the external memory device 104 uses the reference clock signal to generate the DQS signal that the external memory device 104 transmits to the controller 102 when the external memory device 104 transmits a DQ signal to the controller 102.

Although the DQ channel 114 enables bi-directional communication between the controller 102 and the external memory device 104, only one of the two linked devices—the controller 102 or the external memory device 104—can transmit data over the DQ channel 114 at any given time. Thus, when one of the two devices is transmitting a data signal DQ and an associated strobe signal DQS, the other one of the devices is listening; that is, configured to receive the data signal DQ and the strobe signal DQS transmitted by the other device. In some implementations, whichever one of the devices is not transmitting data turns off or otherwise disables its transmitter. During this time, when the device's transmitter is disabled, the output of the transmitter, and particularly the signal on the DQS channel 118, is traditionally said to be in a "tri-state." The tri-state traditionally refers to the "off" state in which the transmitter is neither outputting logic 0 nor logic 1.

When the DQS pin 116a or 116b of one of the devices is in the tri-state, the values of the signal on the DQS channel 118 are indeterminate and typically considered garbage, meaningless, or otherwise not to be used (hereinafter "unusable"). However, the receiver of the other one of the devices may still receive such unusable values from the DQS channel 118 during the tri-state period, for example, after the intended data has been transmitted in response to a read or write command. In some instances, the receiver can receive one or more "spurious" transitions over the DQS channel 118. Thus, the receiver could sample or "strobe" some unwanted values from the DQ channel 114 based on such spurious transitions. The receiver generally includes or functions as a synchronous edge-triggered flip-flop that latches data received over the DQ channel 114 at the rising and falling clock edges of a phase-aligned (e.g., delayed) version of the strobe signal DQS. It is generally desirable that the receiver not strobe data received over the DQ channel 114 during the tri-state period. For example, to facilitate this operation during periods when the controller 102 is preparing to receive data from the external memory device 104 in response to a read command transmitted from the controller 102 to the external memory device 104, the controller 102 internally generates or asserts a DQS enable signal EN that it sends or otherwise communicates to the receiver of the controller 102. When the receiver of the controller 102 receives the asserted enable signal EN, it ungates the strobe signal DQS received from the external memory device 104 such that the receiver can phase align the strobe signal DQS and use it to sample the data in the data signal DQ received from the external memory device 104.

Figure 2:
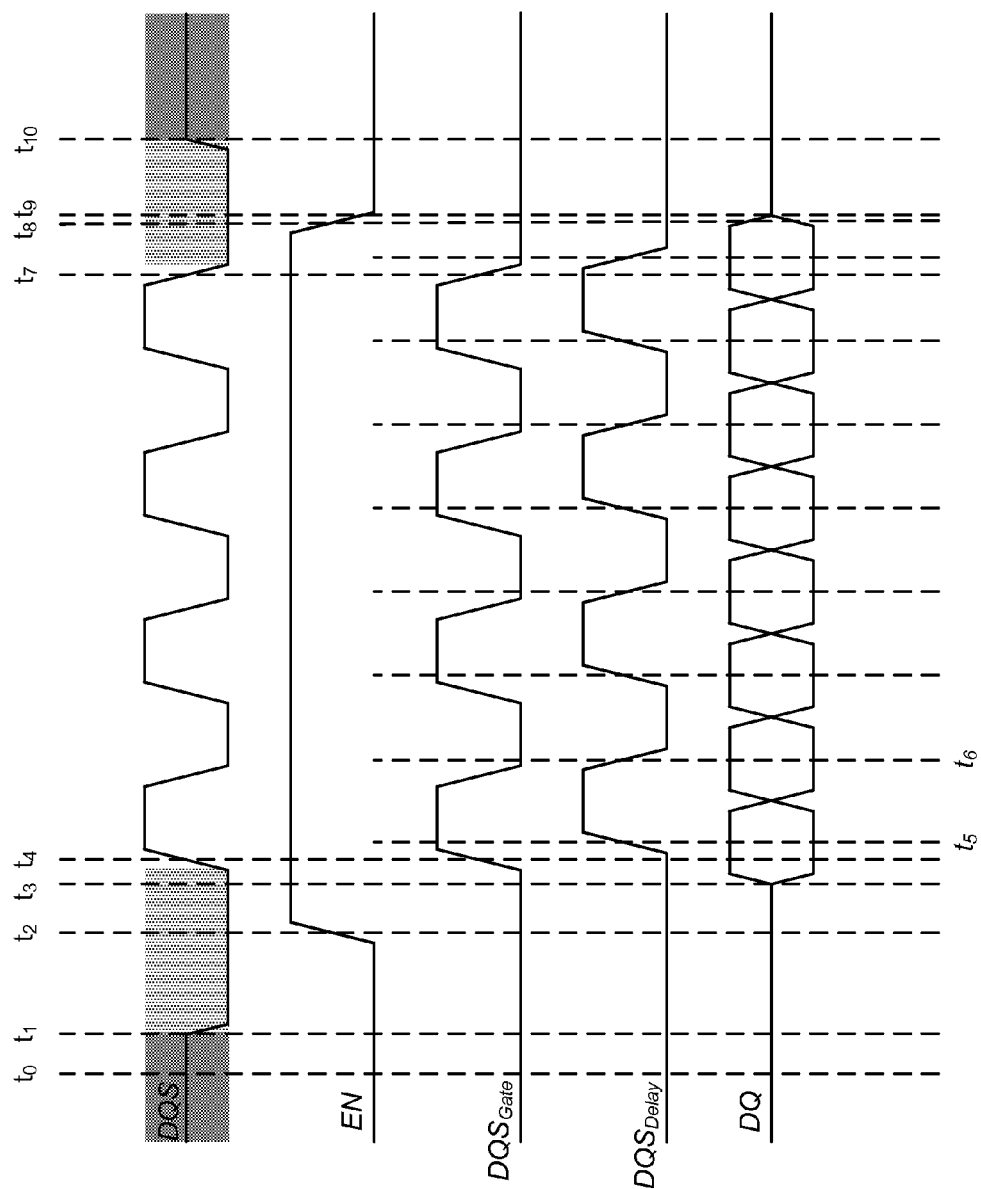
FIG. 2 shows a timing diagram illustrating values of a data signal DQ, a strobe signal DQS, a DQS enable signal EN, a gated DQS signal $DQS_{Gate}$, and a delayed DQS signal $DQS_{Delay}$ in a receiver suitable for use in a controller configured to communicate with an external memory device that utilizes DDR3 SDRAM.

For didactic purposes, a system 100 that includes an external memory device 104 that uses third generation DDR (DDR3) SDRAM will now be briefly described. FIG. 2 shows a timing diagram illustrating values of a data signal DQ, a strobe signal DQS, a DQS enable signal EN, a gated DQS signal $DQS_{Gate}$, and a delayed DQS signal $DQS_{Delay}$ in a receiver suitable for use in a controller 102 configured to communicate with an external memory device 104 that utilizes DDR3 SDRAM. The data signal DQ and the strobe signal DQS are transmitted over the DQ channel 114 and the DQS channel 118, respectively. Herein, and as used in FIG. 2, the physical DQ and DQS channels 114 and 118 may also be referred to by the corresponding signals DQ and DQS, carried by the respective channels. Thus, while it is more proper to say that the DQS pin 116a or 116b is in tri-state, and that the values received over the DQS channel 118 are unusable because the DQS pin 116a or 116b is in tri-state, such an occasion or period may be described herein as the strobe signal DQS itself being in tri-state. That is, the tri-state and preamble periods described below may be described as periods of the DQS signal itself, when in actuality, the DQS signal refers more strictly to the burst of clock edges transmitted in parallel with data. Similarly, while the periods when no actual requested data is being transmitted over the DQ channel 114 may be described as non-data carrying periods of the DQ signal itself, in actuality, the DQ signal refers more strictly to the burst of data bits transmitted in response to a write or read command.

Figure 3:
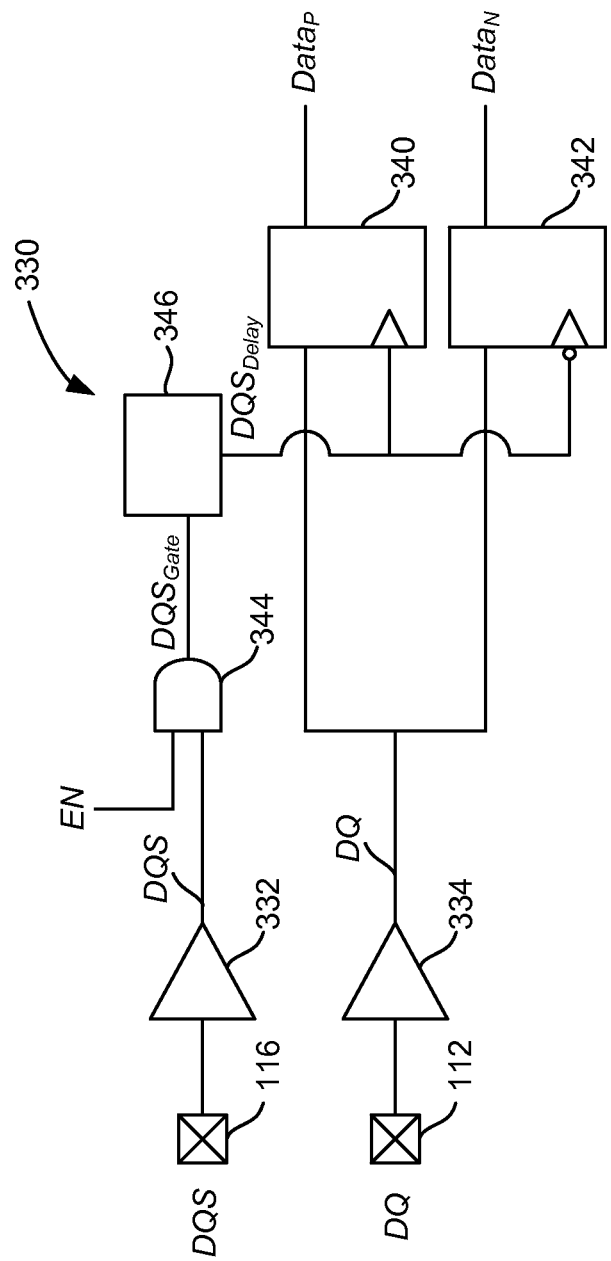
FIG. 3 shows an example receiver suitable for use in a controller configured to communicate with an external memory device that utilizes DDR3 SDRAM.

FIG. 3 shows an example receiver 330 suitable for use in a controller 102 configured to communicate with an external memory device 104 that utilizes DDR3 SDRAM. Receiver 330 includes a first DQS buffer 332 and a second DQ buffer 334. The DQS buffer 332 and the DQ buffer 334 are configured to receive the strobe signal DQS and the data signal DQ, respectively, over the DQS pin 116a and the DQ pin 112a, respectively. In instances in which the strobe signal DQS is a differential signal, the DQS buffer 332 can be a differential buffer, while in instances in which the strobe signal DQS is a single-ended signal, the DQS buffer 332 can be a single-ended buffer. Similarly, in instances in which the data signal DQ is a differential signal, the DQ buffer 334 can be a differential buffer, while in instances in which the data signal DQ is a single-ended signal, the DQ buffer 334 can be a single-ended buffer. However, in DQS system architectures that utilize DDR3 and DDR4 SDRAM devices, the strobe signal DQS is typically a differential signal, and hence the DQS buffer 332 is a differential buffer, while the data signal DQ is typically a single-ended signal, and hence the DQ buffer 334 is a single-ended buffer.

As shown in FIG. 2, at time $t_0$, the DQS channel 118 is in the tri-state (shown as a shaded time period). Thus, any values transmitted over the DQ channel 114 and the DQS channel 118 during this time are regarded as unusable. For example, when the controller 102 transmits a read command to the external memory device 104, the read command is transmitted on a particular clock cycle and reaches the external memory device 104 via the bus 106 within, for example, the next clock cycle or some other number of clock cycles. In response to receiving the read command, the external memory device 104 retrieves the requested data from a memory array in the device 104, enables or "turns on" its transmitter, and transmits the retrieved data as bits in a data signal DQ output from the DQ pin 112b over the DQ channel 114 to the DQ pin 112a of the controller 102. The external memory device 104 also transmits a strobe signal DQS output from the DQS pin 116b over the DQS channel 118 to the DQS pin 116a of the controller 102. More specifically, when the transmitter of the external memory device 104 turns on and leaves the tri-state at time $t_1$, the transmitter of the external memory device 104 transmits a "preamble" over the DQS channel 118 prior to outputting the clock edges of the strobe signal DQS over the DQS channel 118. For example, in the case of DDR3 SDRAM, the preamble has a value of logic "0" or "low" that is unchanging until the transmitter begins outputting the strobe signal DQS at time $t_4$. For example, the total length of the preamble period between time $t_1$ and time $t_4$ can be on the order of a clock cycle.

At some time $t_2$ during the preamble, the internally generated DQS enable signal EN transitions to high (or is otherwise asserted). In the example shown in FIG. 2, the first meaningful bit of data in the data signal DQ is received at time $t_3$, and the first meaningful edge of the strobe signal DQS is received at time $t_4$ (in other instances DQ may begin to arrive at the receiver 330 after DQS depending on path length variations or other variations). When the receiver 330 receives the asserted enable signal EN at time $t_2$, the receiver 330 in the controller 102 is enabled to use the strobe signal DQS transmitted from the external memory device 104 to recover the data in the data signal DQ transmitted from the external memory device 104.

In the illustrated example, the receiver 330 includes an AND logic gate 344 or other gating circuit configured to gate and un-gate the strobe signal DQS based on the DQS enable signal EN. For example, the AND gate 344 is configured to receive the DQS enable signal EN and the strobe signal DQS received from the differential buffer 332, and to output the gated DQS signal $DQS_{Gate}$ based on an AND logical operation of the two signals. More specifically, when the enable signal EN is asserted (e.g., when it is logic 1 or high), the AND gate 344 "un-gates" the strobe signal DQS; that is, the values of DQS can pass through the AND gate 344 and are output as the gated DQS signal $DQS_{Gate}$. In contrast, when the enable signal EN is not asserted (e.g., when it is logic 0 or low), the output of the AND gate 344 or other gating circuit remains fixed at low, and thus, no data is captured by the flip-flops or other latching circuits 340 and 342.

The receiver 330 further includes a delay block 346 configured to introduce a phase delay in the gated DQS signal $DQS_{Gate}$ to generate a delayed DQS signal $DQS_{Delay}$, as shown in FIG. 2. For example, the delay block 346 can include a delay-locked loop (DLL) circuit or phase-locked loop (PLL) circuit. The delay block 346 delays the gated DQS signal $DQS_{Gate}$ such that the rising and falling clock edges in the delayed DQS signal $DQS_{Delay}$ are aligned with, for example, the centers of the data windows of the data bits in the data signal DQ, as shown, for example, at times $t_5$ and $t_6$. More specifically, because the data signal DQ is a DDR signal, it is typically desirable for the delayed DQS signal $DQS_{Delay}$ to be delayed from the data signal DQ by a phase offset of approximately 90 degrees. In this way, two bits of data in the data signal DQ can be reliably captured for each clock cycle of the delayed DQS signal $DQS_{Delay}$. More specifically, for each clock cycle, one data bit of the data signal DQ is sampled, for example by the flip-flop 340, at the rising clock edge of the delayed DQS signal $DQS_{Delay}$ (e.g., at $t_5$) and output as data signal $Data_P$. Similarly, the adjacent data bit is sampled, for example by the flip-flop 342, at the adjacent falling clock edge of the delayed DQS signal $DQS_{Delay}$ (e.g., at $t_6$) and output as data signal $Data_N$.

At time $t_7$, the strobe signal DQS enters a "post-amble" period in which the value of the DQS channel 118 is again fixed at low. The enable signal EN is de-asserted during the post-amble at time $t_8$ thus re-gating the input received over the DQS channel 118 (resulting in a fixed low value for the gated DQS signal $DQS_{Gate}$) and guarding against any inadvertent sampling of unusable data by the receiver 330 based on any spurious transitions received over the DQS channel 118. Time $t_9$ marks the end of the last bit of meaningful data in the data signal DQ. Finally, time $t_{10}$ marks the beginning of the next tri-state period.

In traditional DQS system architectures, the controller 102 maintains a count of the number of clock cycles since the transmission of the read command from the transmitter of the controller 102 to the external memory device 104. When a predetermined number of clock cycles have lapsed, the controller 102 asserts the enable signal EN. In some of these or in other implementations, the controller 102 also can include an adjustable delay chain, located for example prior to the AND gate 344, which functions to introduce phase adjustments of less than one integer clock cycle. The assertion of the enable signal EN results in the un-gating, by the AND gate 344 in the receiver of the controller 102, of the input received over the DQS channel 118 in preparation for receiving the DQS and DQ signals from the external memory device 104. Some number of clock cycles after the enable signal EN is asserted, the receiver receives the strobe signal DQS and the data signal DQ from the external memory device 104. However, in a read operation, there are generally long path distances and times involved in transmitting a read command from the controller 102 to the external memory device 104, in retrieving data from within the external memory device 104, and in subsequently transmitting the retrieved data and strobe signals DQ and DQS, respectively, from the external memory device 104 to the controller 102. Variations due to, for example, rapid voltage fluctuations or jitter, are proportional to these long path lengths. In traditional system architectures, such as in DDR3 SDRAM compatible devices, such variations can make asserting the enable signal EN within the preamble period (between time $t_1$ and time $t_4$) a challenge. For example, the clock frequencies used in DDR3 and DDR4 SDRAM can be on the order of 1 Giga-Hertz (GHz) or greater. If the enable signal EN is asserted too early (e.g., within the tri-state period prior to start of the preamble period at time $t_1$), the flip-flops 340 and 342 can latch unusable data if spurious transitions are received over the DQS channel 118. Conversely, if the enable signal EN is asserted too late (e.g., after the preamble period ends at time $t_4$), the flip-flops 340 and 342 can miss some of the meaningful data bits transmitted over the DQ channel 112 beginning at time $t_3$ because the flip-flops 340 and 342 can't latch data without the edge transitions transmitted in the strobe signal DQS, and the edge transitions aren't received by the flip-flops 340 and 342 until after the AND gate 344 un-gates the input received over the DQS pin 116 from the DQS channel 118. More specifically, for example, if the enable signal EN is asserted late and transitions during the first high pulse of the strobe signal DQS, then the first high pulse in the gated strobe signal $DQS_{Gate}$ will be truncated and the second edge of DQS will become the first edge in $DQS_{Gate}$; that is, the first edge in $DQS_{Gate}$ will be shifted to the right and may not be ideally centered relative to the first data bit value in the data signal DQ.

Particular implementations relate to a system 100 that includes a controller 102 that is configured to communicate with an external memory device 104 that conforms to a pseudo open drain JO standard, such as, for example, a DDR4 SDRAM device. As such, for clarity and ease of explanation, the external memory device 104 of particular implementations may hereinafter be referred to as DDR4 SDRAM 104, although it is contemplated that other implementations may be utilized in other systems in which the external memory device 104 includes a transmitter that conforms to an IO standard in which the strobe signal DQS has a determinate tri-state as opposed to an indeterminate tri-state. In some implementations, the controller 102 can be a configurable circuit such as a programmable logic device (PLD). For example, the controller 102 can be a complex programmable logic device (CPLD) or a field-programmable gate array (FPGA). In some other implementations, the controller 102 can be a different type of configurable circuit, such as a configurable application specific IC (ASIC) or a structured ASIC.

In particular implementations, the receiver in the controller 102 is configured to automatically assert or "self-align" a DQS enable signal EN within the preamble period of a strobe signal DQS. The asserted DQS enable signal EN is then used to un-gate the input received from the DQS pin such that the strobe signal DQS can be passed through to other components of the receiver. This is in contrast to the receiver 330 described above with reference to FIGS. 2 and 3, in which the controller 102 asserts the enable signal EN after a predetermined number of clock cycles have lapsed or after some other static measurement. Similarly, in particular implementations, the receiver in the controller 102 is configured to automatically de-assert the DQS enable signal EN within a post-amble period of the strobe signal DQS. The de-asserted DQS enable signal EN is then used to gate the input received from the DQS pin such that the strobe signal DQS is not passed through other components of the receiver.

In a DDR4 SDRAM 104, the output buffer in the transmitter includes a pseudo open drain IO. More specifically, the output buffer of the transmitter includes a strong pull-up mechanism, such as a low resistance circuit connected between the positive power rail $V_{DD}$ and the output of the buffer (e.g., the DQS pin 116b), that has the effect of rapidly pulling up the voltage on the output from a floating level to logic 1 (high) during the tri-state period when the transmitter is disabled. Because the strobe signal DQS is a differential signal, the result of the pseudo open drain IO is that, during the tri-state period, both components of the differential strobe signal DQS are pulled up to high; that is, both the first (e.g., "positive") component $DQS_P$ and the second (e.g., "negative") component $DQS_N$ of the differential strobe signal DQS are simultaneously high.

Figure 4A:
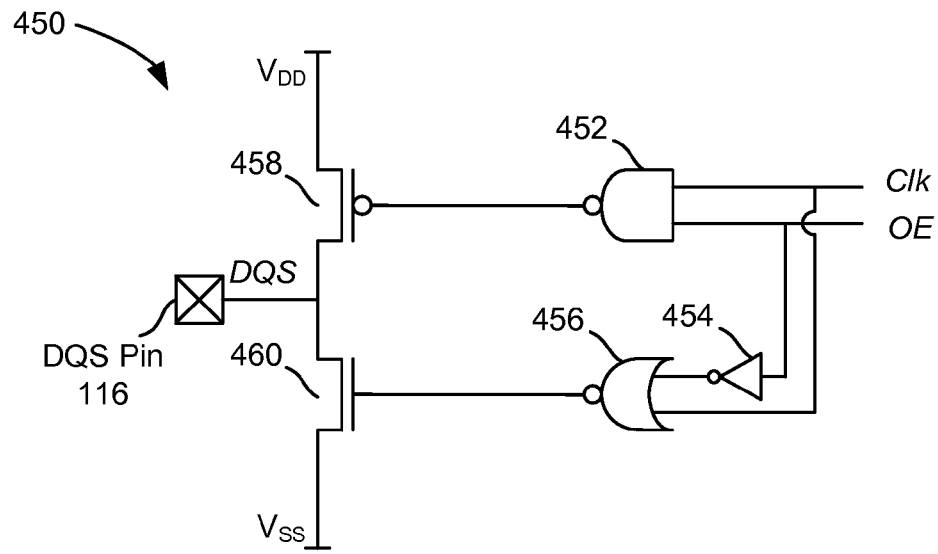
FIG. 4A shows an example stub series terminated logic (SSTL) output buffer suitable for use in a transmitter of a DDR3 SDRAM device.

By way of comparison, FIG. 4A shows an example stub series terminated logic (SSTL) output buffer 450 suitable for use in a transmitter of a DDR3 SDRAM device. DDR3 compatible devices, unlike DDR4 compatible devices, do not include a pseudo open drain IO. As such, and as described above, the output of the DQS pin in a DDR3 device is floating or indeterminate during the tri-state period; that is, it is neither low nor high. The output buffer 450 includes a NAND gate 452 configured to receive a clock signal Clk and an output enable signal OE. The output buffer 450 also includes an inverter or "NOT" gate 454 configured to invert the value of the output enable signal OE. A NOR gate 456 is configured to receive the inverted output enable signal OE and the clock signal Clk. The output buffer 450 further includes a PMOS "pull-up" transistor 458 and an NMOS "pull-down" transistor 460. The PMOS transistor 458 is configured to switch on and pull-up the DQS pin 116 of the transmitting device to high when the output of the NAND gate 452 is low. The NMOS transistor 460 is configured to switch on and pull-down the DQS pin 116 to low when the output of the NOR gate 456 is high. Table 1 (below) shows a truth table that includes logical values for the Clk and OE signals and for the corresponding outputs of the NAND gate 452, NOT gate 454, NOR gate 456, and DQS pin 116. As shown in Table 1, when the output enable signal OE is high, the transmitter is enabled or "on," and the strobe signal DQS takes the value of the clock signal Clk. But when the value of the output enable signal OE is low, the transmitter is effectively disabled and in a floating tri-state. As a result, the output on the DQS pin 116 is floating (shown as "Z") because neither the PMOS transistor 458 nor the NMOS transistor 460 is pulling up or down on the DQS pin 116. As noted above, DQS signals used in DDR3 SDRAM system architectures are differential, hence, the clock, output enable, and strobe signals Clk, OE, and DQS, respectively, described with reference to FIG. 4A may refer to differential signals while some or all of the components described with reference to FIG. 4A may be understood to refer to pairs of complimentary components configured to operate using the corresponding components of the differential signals.

TABLE 1

| Clk | OE | NOT | NOR | NAND | DQS |
|-----|----|----|-----|------|-----|
| 0 | 0 | 1 | 0 | 1 | Z |
| 1 | 0 | 1 | 0 | 1 | Z |
| 0 | 1 | 0 | 1 | 1 | 0 |
| 1 | 1 | 0 | 0 | 0 | 1 |

TABLE 2

| Clk | OE | NOT | NOR | NAND | DQS |
|-----|----|----|-----|------|-----|
| 0 | 0 | 1 | 0 | 1 | 1 |
| 1 | 0 | 1 | 0 | 1 | 1 |
| 0 | 1 | 0 | 1 | 1 | 0 |
| 1 | 1 | 0 | 0 | 0 | 1 |

Figure 4B:
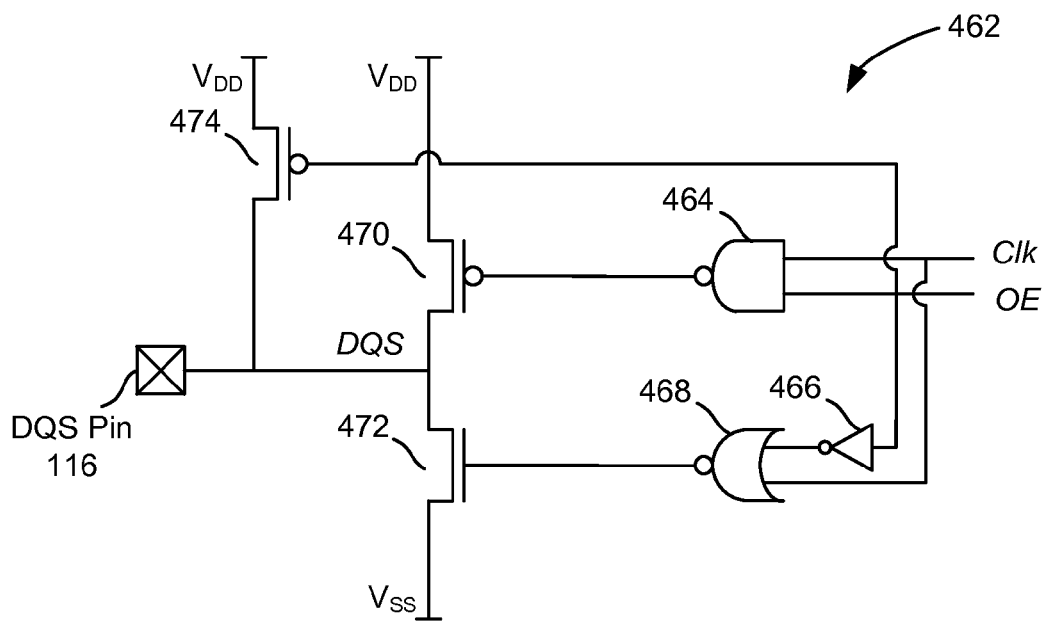
FIG. 4B shows a simple example of a pseudo open drain (POD) output buffer.

FIG. 4B shows a simple example of a pseudo open drain (POD) output buffer 462. However, the transmitter in an actual DDR4 SDRAM device, such as DDR4 SDRAM device 104, may include a considerably more complex pseudo open drain IO. Similar to the SSTL output buffer 450, the POD output buffer 462 includes a NAND gate 464 configured to receive a clock signal Clk and an output enable signal OE. The output buffer 462 also includes a NOT gate 466 configured to invert the value of the output enable signal OE, and a NOR gate 468 configured to receive the inverted output enable signal OE and the clock signal Clk. The output buffer 462 further includes a PMOS pull-up transistor 470 and an NMOS pull-down transistor 472. Similar to the output buffer 450, the PMOS transistor 470 is configured to switch on and pull-up the DQS pin 116 to high when the output of the NAND gate 464 is low. The NMOS transistor 472 is configured to switch on and pull-down the DQS pin 116 to low when the output of the NOR gate 468 is high. But unlike the DDR3 architecture of FIG. 4A, in the pseudo open drain architecture of FIG. 4B, the output buffer 462 further includes a second PMOS pull-up transistor 474 that is also configured to receive the output enable signal OE. Table 2, above, shows a truth table that includes logical values for the Clk and OE signals and for the corresponding outputs of the NAND gate 464, NOT gate 466, NOR gate 468, and DQS pin 116. As shown in Table 2, when the output enable signal OE is asserted (e.g., high), the transmitter is enabled or "on," and the strobe signal DQS takes the value of the clock signal Clk. But when the value of the output enable signal OE is de-asserted (e.g., low), the transmitter is effectively disabled. However, in contrast to the DDR3-compatible transmitter of FIG. 4A, in which the DQS pin 116 enters a floating tri-state when the output enable signal OE is low, in the transmitter of FIG. 4B, the DQS pin 116 is pulled up to high during the tri-state period by the second PMOS pull-up transistor 474 despite the fact that neither the PMOS transistor 470 nor the NMOS transistor 472 is pulling up or down on the DQS pin 116. Hence, in contrast to the DDR3-compatible transmitter of FIG. 4A, when the output enable signal OE is low, both components $DQS_P$ and $DQS_N$ of the differential signal DQS are high. As noted above, DQS signals used in DDR4 SDRAM system architectures are differential, hence, the clock, output enable, and strobe signals Clk, OE, and DQS, respectively, described with reference to FIG. 4B may refer to differential signals while some or all of the components described with reference to FIG. 4B may be understood to refer to pairs of complimentary components configured to operate using the corresponding components of the differential signals.

Figure 5:
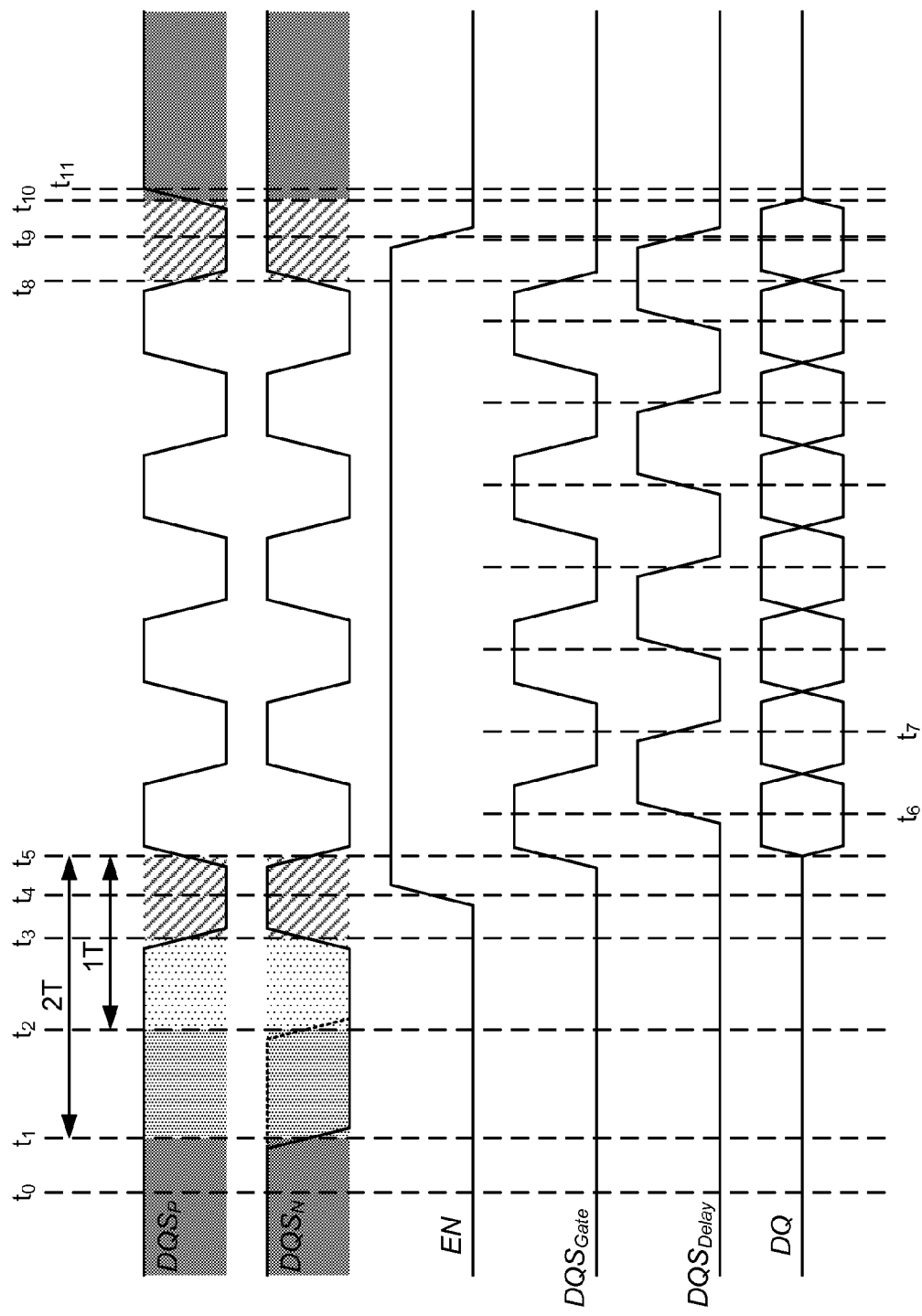
FIG. 5 shows a timing diagram illustrating values of a data signal DQ, a strobe signal DQS, a DQS enable signal EN, a gated DQS signal $DQS_{Gate}$, and a delayed DQS signal $DQS_{Delay}$ in a receiver suitable for use in a controller configured to communicate with an external memory device that utilizes DDR4 SDRAM.

FIG. 5 shows a timing diagram illustrating values of a data signal DQ, a strobe signal DQS, a DQS enable signal EN, a gated DQS signal $DQS_{Gate}$, and a delayed DQS signal $DQS_{Delay}$ in a receiver suitable for use in both an external memory device 104 that utilizes DDR4 SDRAM, or a controller 102 configured to communicate with an external memory device 104 that utilizes DDR4 SDRAM. The data signal DQ and the strobe signal DQS are transmitted over the DQ channel 114 the DQS channel 118, respectively. To perform a read operation, the controller 102 transmits a read command to the DDR4 SDRAM 104. To complete the read operation, the transmitter of the DDR4 SDRAM 104 transmits a strobe signal DQS using an output buffer having a pseudo open drain JO, such as that described with reference to FIG. 4B, along with a data signal DQ to the receiver of the controller 102. As described above, the receiver in the controller 102 also needs an asserted enable signal EN to prepare to receive the DQS and DQ signals. As will be described below, the DQS enable signal EN is internally generated and asserted or de-asserted by control logic within the receiver.

Figure 6:
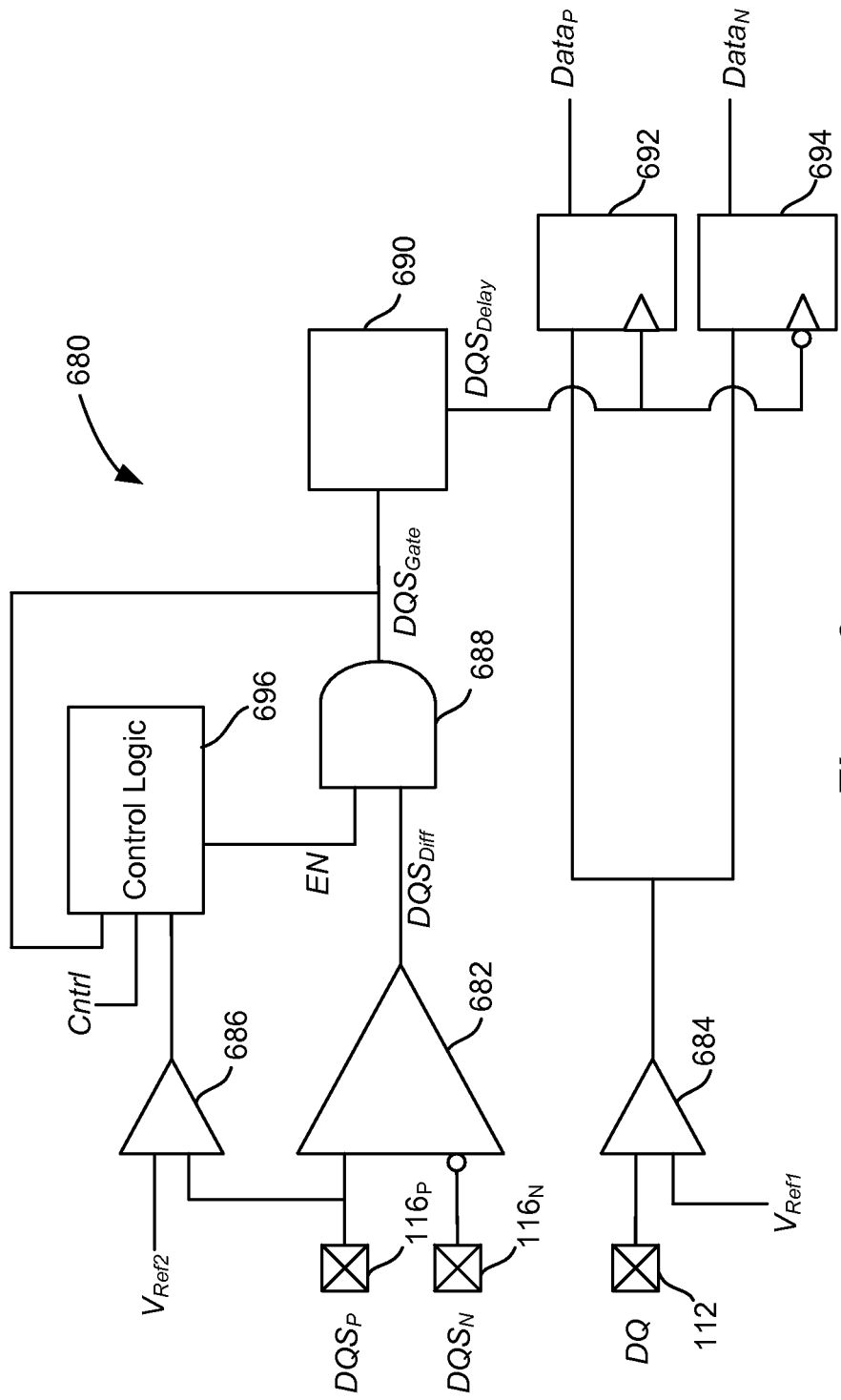
FIG. 6 shows an example receiver suitable for use in a controller configured to communicate with an external memory device that utilizes DDR4 SDRAM.

FIG. 6 shows an example receiver 680 suitable for use in a controller 102 configured to communicate with an external memory device 104 that utilizes DDR4 SDRAM. Receiver 680 includes a first differential DQS buffer 682 and a second single-ended DQ buffer 684. For ease of description of certain implementations, because the strobe signal DQS is a differential signal, the DQS pin 116 of FIG. 6 is shown as two complimentary pins $116_P$, for receiving the first ("positive") component $DQS_P$ of the differential strobe signal DQS, and $116_N$, for receiving the second ("negative") component $DQS_N$ of the differential strobe signal DQS. The differential DQS buffer 682 is configured to receive the first and second components, $DQS_P$ and $DQS_N$, respectively, of the differential strobe signal DQS over the DQS pins $116_P$ and $116_N$, respectively. The single-ended DQ buffer 684 is configured to receive the data signal DQ over the DQ pin 112. The single-ended DQ buffer 684 is configured to receive a reference voltage $V_{Ref1}$ (e.g., $V_{DD}/2$ or some other suitable value) usable by the DQ buffer 684 in determining whether the value of the data in the data signal DQ is logic high or low. In circuits that employ the DQS system architecture, the reference voltage $V_{Ref}$ is typically a dedicated reference voltage that is either internally generated or provided externally.

As shown in FIG. 5, at time $t_0$, the pseudo open drain transmitter is disabled and the values of both the first component $DQS_P$ of the differential strobe signal DQS and the second component $DQS_N$ of the differential strobe signal DQS are high. Thus, any values transmitted over the DQ channel 114 and received by the DQ pin 112 of FIG. 6 during this time are regarded as unusable. When the transmitter turns on and leaves the tri-state, the transmitting device transmits a preamble over the DQS channel 118 prior to outputting the clock edges of the strobe signal DQS over the DQS channel 118. For example, in the case of DDR4 SDRAM, the transmitter can be configured to output a preamble having one of two lengths, 1T or 2T, having time durations of approximately one clock cycle period (T) and approximately two clock cycle periods, respectively. During the preamble, the first component $DQS_P$ of the differential strobe signal DQS is high while the second component $DQS_N$ of the differential strobe signal DQS is low. For example, in the case of a 2T preamble, the preamble begins at $t_1$, while in the case of a 1T preamble, the preamble begins at $t_2$. Of note, in some implementations, the controller 102 and the DDR4 SDRAM 104 are configured to use the 1T preamble: in this way, the time equivalent of one clock cycle can be saved every time the device switches from a transmitting state to a receiving state and vice versa. This time saving is made possible as a direct result of the ability to automatically assert the DQS enable signal EN rather than having to count clock edges or perform some other measurement where it would be useful to have a longer preamble within which to assert the enable signal.

Unlike in a DDR3 protocol preamble, in the DDR4 protocol preamble, the strobe signal DQS transitions once during the preamble, as shown at time $t_3$ in FIG. 5. As shown in FIG. 6, the receiver 680 further includes an additional single-ended buffer 686 configured to receive the first component $DQS_P$ of the differential strobe signal DQS. The single-ended buffer 686 also is configured to receive a reference voltage $V_{Ref2}$ (e.g., $V_{DD}/2$ or some other suitable value) usable by the buffer 686 in determining whether the value of the first component $DQS_P$ of the differential strobe signal DQS is logic high or low. The reference voltage $V_{Ref2}$ used by the single-ended buffer 686 can be the same or different than the reference voltage $V_{Ref1}$ used by the single-ended buffer 684. In implementations in which the reference voltage $V_{Ref2}$ is different, the reference voltage $V_{Ref2}$ can be a dedicated reference voltage that is either internally generated or provided externally. Of note, because the differential input buffer 682 would generally have a different propagation delay than the single-ended buffer 686, the receiver 680 may further include one or more static delay elements (not shown) inserted after one of the buffers 682 or 686 to compensate for the skew introduced by the difference in propagation delays.

The receiver 680 further includes gating control logic 696 configured to receive the output of the buffer 686. Because it is known that the differential signal DQS transitions once during the preamble, and because it is known that the value of the first component $DQS_P$ of the differential strobe signal DQS is high during tri-state (because it is pulled-up by the pseudo open drain IO), it follows that when the gating control logic 696 detects a falling clock edge in the first component $DQS_P$ of the differential strobe signal DQS at time $t_3$, it is known that the burst of clock edges in the strobe signal DQS will begin shortly (e.g., within approximately one-half of a clock cycle) at time $t_5$. Thus, this information about the transition at $t_3$ can be used by the control logic 696 to automatically trigger the assertion of the DQS enable signal EN at a time $t_4$ within an "un-gating" window extending from approximately $t_3$ to approximately $t_5$.

Figure 7:
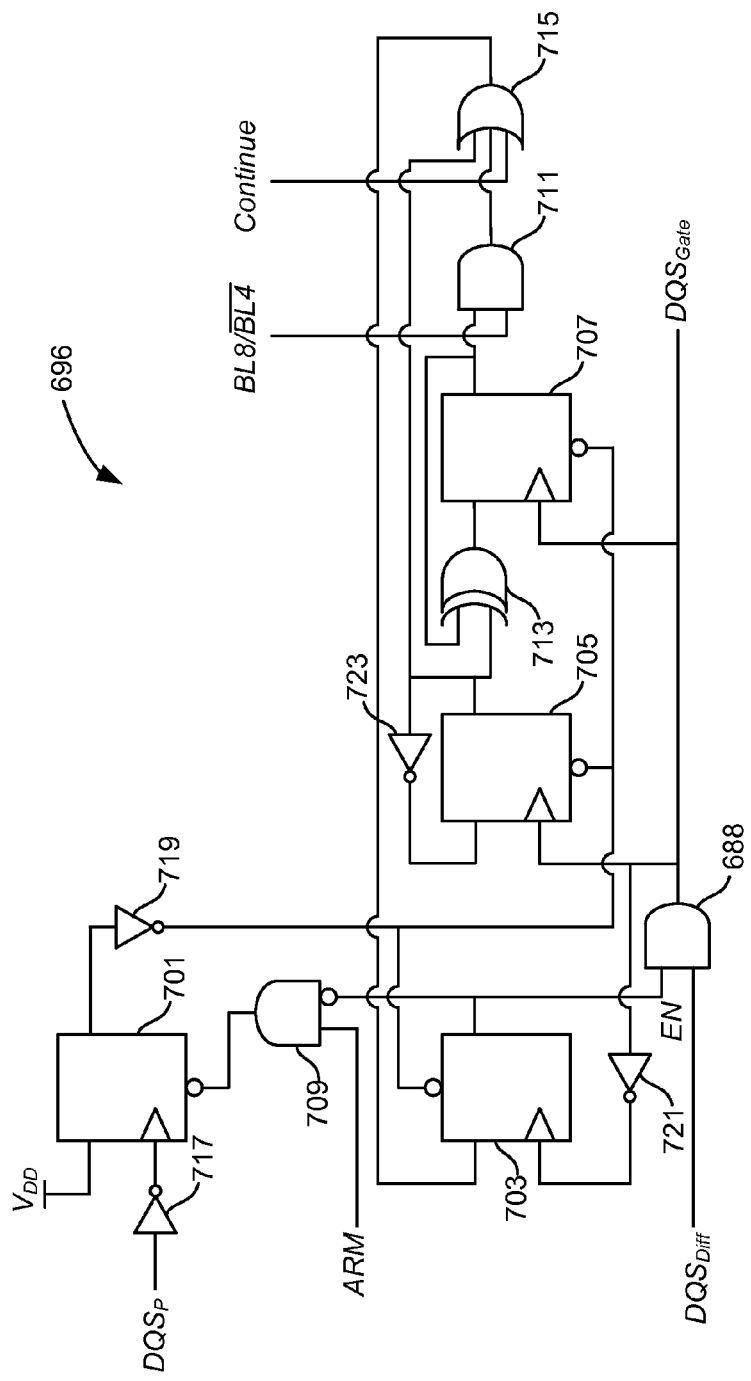
FIG. 7 shows an example circuit for implementing the gating control logic in the receiver of FIG. 6.

FIG. 7 shows an example circuit for implementing the gating control logic 696 in the receiver 680 of FIG. 6. In the implementation shown in FIG. 7, the gating control logic 696 includes flip-flops or other latching circuits 701, 703, 705, and 707, AND gates 709 and 711, XOR gate 713, OR gate 715, and NOT gates 717, 719, 721, and 723. The result of the circuit is that flip-flop 703 generates the enable signal EN based on the first component of the differential signal $DQS_P$, as described above, and in response to the control signals ARM, BL8 (or BL4), and Continue.

Similar to the receiver 330 described above, the receiver 680 further includes an AND logic gate 688 or other gating circuit configured to gate and un-gate the strobe signal DQS based on the value of the DQS enable signal EN. A significant difference between the receiver 680 and the receiver 330 is that the DQS enable signal EN is generated and asserted and de-asserted internally by the control logic 696 within the receiver 680. The AND gate 688 is configured to receive the DQS enable signal EN and the buffered strobe signal $DQS_{Diff}$ received from the differential buffer 682, and to output the gated DQS signal $DQS_{Gate}$ based on an AND logical operation. More specifically, when the enable signal EN is asserted (e.g., when it is logic 1 or high) at time $t_4$, the AND gate 688 "un-gates" the strobe signal $DQS_{Diff}$; that is, the values of $DQS_{Diff}$ pass through the AND gate 688 and are output as the gated DQS signal $DQS_{Gate}$. In contrast, when the enable signal EN is not asserted (e.g., when it is logic 0 or low), the output of the AND gate 688 or other gating circuit remains fixed at low, and thus, no data is sampled and latched by the flip-flops or other latching circuits 692 and 694.

Similar to the receiver 330 described above, the receiver 680 further includes a delay block 690 configured to introduce a phase delay in the gated DQS signal $DQS_{Gate}$ to generate a delayed DQS signal $DQS_{Delay}$, as shown in FIG. 5. For example, the delay block 690 can include a delay-locked loop (DLL) circuit or phase-locked loop (PLL) circuit. The delay block 690 delays the gated DQS signal $DQS_{Gate}$ such that the rising and falling clock edges in the delayed DQS signal $DQS_{Delay}$ are aligned with, for example, the centers of the data windows of the data bits in the data signal DQ, as shown, for example, at times $t_6$ and $t_7$. More specifically, because the data signal DQ is a DDR signal, it is typically desirable for the delayed DQS signal $DQS_{Delay}$ to be delayed from the data signal DQ by a phase offset of approximately 90 degrees. In this way, two bits of data in the data signal DQ can be reliably sampled for each clock cycle of the delayed DQS signal $DQS_{Delay}$. More specifically, for each clock cycle, one data bit of the data signal DQ is sampled, for example by the flip-flop 692, at the rising clock edge of the delayed DQS signal $DQS_{Delay}$ (e.g., at $t_6$) and output as data signal $Data_P$. Similarly, the adjacent data bit is sampled, for example by the flip-flop 694, at the adjacent falling clock edge of the delayed DQS signal $DQS_{Delay}$ (e.g., at $t_7$) and output as data signal $Data_N$.

At time $t_8$, the strobe signal DQS begins a "post-amble" period in which the value of the first component $DQS_P$ of the differential signal DQS is logic 0 (low) and in which the value of the second component $DQS_N$ of the differential signal DQS is logic 1 (high). The control logic 696 is configured to automatically de-assert the DQS enable signal EN during the post-amble at time $t_9$ thus re-gating the input from the DQS channel 118 and guarding against any inadvertent sampling of unusable data by the receiver 680 based on any spurious transitions received over the DQS channel 118. Time $t_{10}$ marks the end of the last bit of meaningful data in the data signal DQ. Finally, time $t_{11}$ marks the beginning of the next tri-state period. The control logic 696 can be configured to automatically de-assert the DQS enable signal EN based on the output of the AND gate 688 and, in some implementations, in conjunction with one or more control signals Cntrl received by the control logic 696. In some implementations, the control logic 696 can be configured to assert the DQS enable signal EN until a number "n" of falling clock edges in the un-gated signal $DQS_{Gate}$ output from the AND gate 688 are detected by the control logic 696. In some such implementations, the number n is received via the control signal Cntrl and refers to the burst length of the strobe signal DQS to be transmitted to the receiver 680. In some implementations, the control logic 696 also receives one or more other control signals, such as a control signal that restarts the burst length counter used to count the falling clock edges in the un-gated signal $DQS_{Gate}$ output from the AND gate 688. Other control signals may cause the control logic 696 to skip certain un-gated signal $DQS_{Gate}$ cycles such as, for example, in between bursts when the end of the first burst continues directly into the preamble of the next burst.

Figure 8:
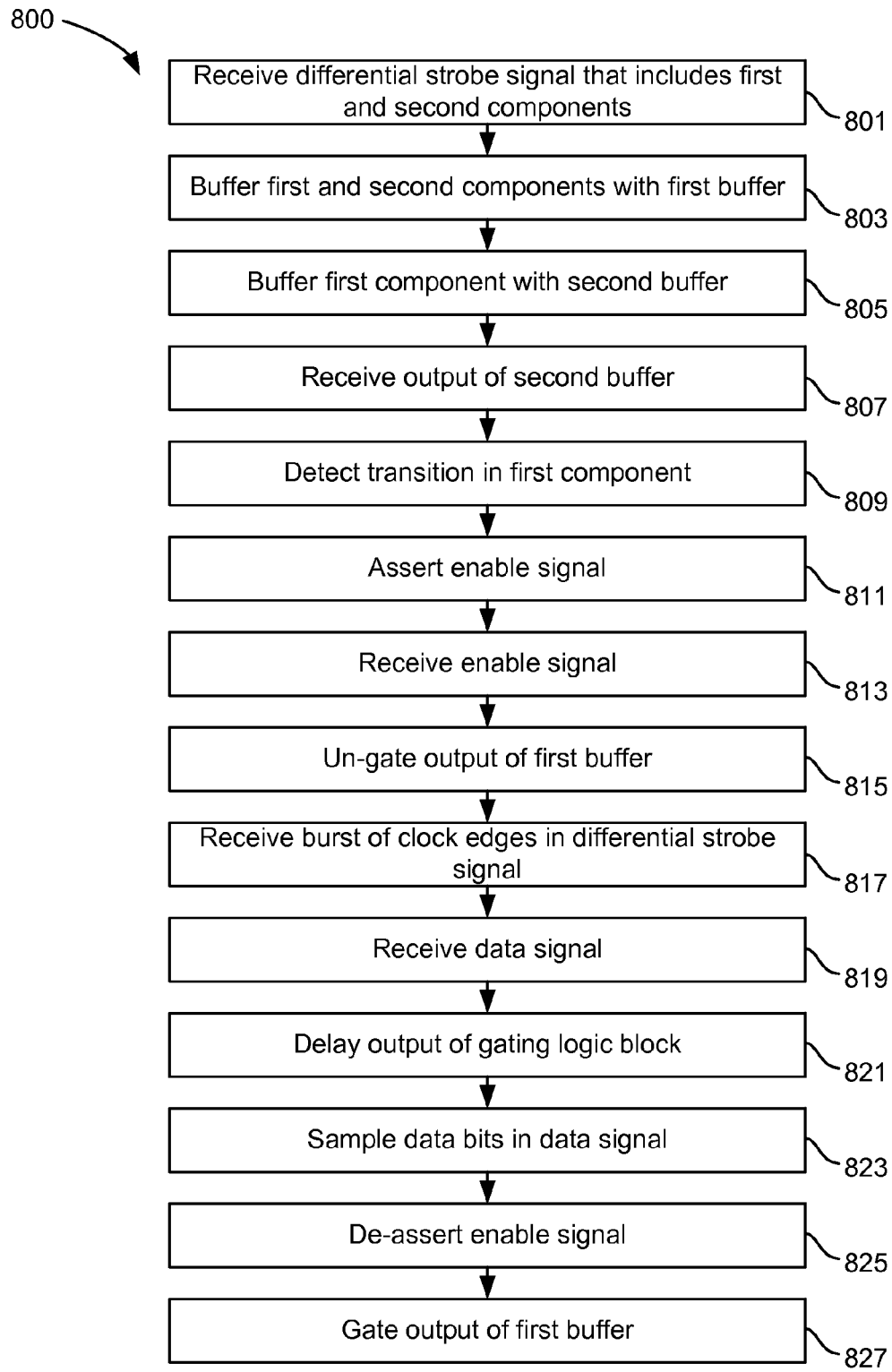
FIG. 8 shows a flowchart illustrating an example process for automatically gating and un-gating a data strobe signal.

FIG. 8 shows a flowchart illustrating an example process for automatically gating and un-gating a data strobe signal. For example, the process 800 can be performed by the receiver 680 just described. The process 800 begins at 801 with receiving, by a configurable circuit, a differential strobe signal that includes a first component and a second component. A first buffer buffers both the first component and the second component of the differential strobe signal at 803. A second buffer buffers the first component of the differential strobe signal at 805. In some implementations, some or all of steps 803 and 805 are performed concurrently. A control logic block receives the output of the second buffer at 807. The process then proceeds when the control logic block detects, at 809, a transition in the first component of the differential strobe signal from a first logic state to a second logic state. In response to the detection of the transition, the control logic block asserts, at 811, an enable signal. A gating logic block receives the asserted enable signal at 813. At 815, the gating logic block then un-gates the output of the first buffer such that the output of the first buffer can be passed through the gating logic block. In some implementations, the gating logic block then receives a burst of clock edges in the differential strobe signal at 817. In some implementations, a data signal is received at 819 approximately commensurately in parallel with the burst of clock edges in the differential strobe signal.

In some implementations, the output of the gating logic block is delayed at 821 such that the clock edges in the output of the gating logic block are approximately aligned with the centers of data bits in the data signal. The data bits in the data signal are sampled at the clock edges at step 823. In some implementations, after a number of clock edges in the differential strobe signal are received, the control logic block, at 825, then de-asserts the enable signal. When the enable signal is de-asserted, the gating logic block then gates, at 827, the output of the first buffer such that the output of the first buffer is not passed through the gating logic block.

In conclusion, the disclosed implementations do not suffer from the timing problems associated with path length variations and other variations that can make it difficult to align the DQS enable signal within the preamble window in order to avoid the inadvertent capture of unusable data. The disclosed implementations provide an elegant solution to such timing problems by providing additional circuitry that is configured to automatically assert the DQS enable signal and thus to automatically un-gate and re-gate the input received over the DQS channel. Some implementations include one or more of the following advantages in addition to those described above. For example, the control logic 696 described with reference to FIGS. 5 and 6 can be self-contained in hard logic near to the DQS input, requiring less silicon or die area and, in implementations in which the controller is or is included within an FPGA, less FPGA core area. Some implementations are especially useful or advantageous in FPGAs because of the availability of extra single-ended buffers in FPGAs. For example, an FPGA typically includes a differential buffer for each set of differential IO pins as well as a pair of single-ended buffers—one for each individual pin of the pair. Thus, an extra single-ended buffer suitable for use as the buffer 686 could be taken from what would otherwise be a differential pair of single-ended buffers. Additionally, it is expected that the improved timing will allow the use of faster DDR4 interfaces.

Although many of the components and processes are described above in the singular for convenience, it will be appreciated by one of skill in the art that multiple components and repeated processes also can be used to practice the techniques of this disclosure. While particular embodiments have been particularly shown and described with reference to specific implementations thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. Additionally, certain steps in one or more of the processes above may be omitted, performed multiple times, performed in parallel, and performed in different orders. It is therefore intended that the invention be interpreted to include all variations and equivalents that fall within the true spirit and scope of the present invention.

What is claimed is:

1. A method comprising:
   receiving, by a circuit, a differential strobe signal from a pseudo open drain output buffer, the differential strobe signal including a first component and a second component, the first component and the second component both being at a first logic state;
   buffering, by a first differential input buffer, both the first component and the second component of the differential strobe signal;
   buffering, by a second input buffer, the first component of the differential strobe signal;

receiving, by a control logic block, an output of the second input buffer;

detecting, by the control logic block, a transition in the first component of the differential strobe signal from the first logic state to a second logic state;

asserting, by the control logic block, an enable signal in response to the detection of the transition;

receiving, by a gating logic block, the asserted enable signal and an output of the first differential input buffer; and un-gating, by the gating logic block, the output of the first differential input buffer in response to receiving the asserted enable signal.

2. The method of claim 1, further comprising:

receiving a burst of clock edges in the differential strobe signal after the output of the differential input buffer is un-gated; and receiving a data signal including a burst of data bits approximately commensurately in parallel with the burst of clock edges in the differential strobe signal.

3. The method of claim 2, further comprising:

delaying the output of the un-gated first differential input buffer to align each clock edge in the burst of clock edges with an approximate center of a corresponding one of the data bits in the burst of data bits; and sampling the data bits in the data signal based on the aligned clock edges.

4. The method of claim 2, further comprising, after a number of clock edges in the differential strobe signal are received, de-asserting, by the control logic block, the enable signal.

5. The method of claim 4, further comprising, in response to the de-assertion of the enable signal, gating, by the gating logic block, the output of the first differential input buffer.

6. The method of claim 1 wherein the data signal is a double data rate DQ signal and the differential strobe signal is a DQS signal, and wherein two data bits in the DQ signal are sampled for each clock cycle of the DQS signal, a first of the two data bits being sampled at a rising edge of the clock cycle and a second of the two data bits being sampled at a falling clock edge of the clock cycle.

7. The method of claim 6, wherein the method is performed in a receiving circuit of a controller, and wherein the pseudo open drain output buffer is an output buffer of a DDR4 SDRAM memory device.

8. A method comprising:

receiving, by one or more buffers, a differential strobe signal from a pseudo open drain output buffer, the differential strobe signal including a first component and a second component, the differential strobe signal being characterized by at least three periods including a deterministic tri-state period, a preamble period after the tri-state period, and a burst period after the preamble period, wherein:

the deterministic tri-state period is characterized by a time duration during which both the first component and the second component are at a first logic state;

the preamble period is characterized by:

a first transition period during which the second component transitions from the first logic state to a second logic state, a first holding period during which the first component is at the first logic state and the second component is at the second logic state, a second transition period during which the first component transitions from the first logic state to the second logic state and during which the second component transitions from the second logic state to the first logic state, and a second holding period during which the first component is at the second logic state and the second component is at a first logic state; and the burst period is characterized by a burst of alternating first and second clock edges;

detecting, by a control logic block, the transition of the first component from the first logic state to the second logic state during the preamble period;

asserting, by the control logic block, an enable signal in response to the detection of the transition;

receiving, by a gating logic block, the asserted enable signal and the differential strobe signal; and un-gating, by the gating logic block, the differential strobe signal during the second holding period in response to receiving the asserted enable signal.

9. The method of claim 8, further comprising receiving a data signal including a burst of data bits during the burst period approximately commensurately in parallel with the burst of clock edges in the differential strobe signal while in the burst period.

10. The method of claim 9, further comprising:

delaying the un-gated differential strobe signal while in the burst period to align each clock edge in the burst of clock edges with an approximate center of a corresponding one of the data bits in the burst of data bits; and sampling the data bits in the data signal during the burst period based on the aligned clock edges.

11. The method of claim 9, further comprising, after a number of clock edges in the differential strobe signal are received during the burst period, de-asserting, by the control logic block, the enable signal.

12. The method of claim 11, further comprising, in response to the de-assertion of the enable signal, gating, by the gating logic block, the differential strobe signal.

13. The method of claim 10, wherein the data signal is a double date rate DQ signal and the differential strobe signal is a DQS signal, and wherein two data bits in the DQ signal are sampled for each clock cycle of the DQS signal, a first of the two data bits being sampled at a rising edge of the clock cycle and a second of the two data bits being sampled at a falling clock edge of the clock cycle.

14. The method of claim 13, wherein the method is performed in a receiving circuit of a controller, and wherein the pseudo open drain output buffer is an output buffer of a DDR4 SDRAM memory device.

15. The method of claim 8, wherein each first clock edge marks a transition of the first component from the second logic state to the first logic state and a substantially simultaneous transition of the second component from the first logic state to the second logic state, and each second clock edge marks a transition of the first component from the first logic state to the second logic state and a substantially simultaneous transition of the second component from the second logic state to the first logic state.

16. A circuit comprising:

a first differential input buffer configured to:

receive a differential strobe signal from a pseudo open drain output buffer, the differential strobe signal including a first component and a second component, the first component and the second component both being at a first logic state, and output a buffered differential strobe signal based on the received first and second components of the differential strobe signal;

a second input buffer configured to receive the first component of the differential strobe signal and to output a buffered first component of the differential strobe signal based on the received first component of the differential strobe signal;

a control logic block configured to:
  receive the output of the second input buffer,
  detect a transition in the first component of the differential strobe signal from the first logic state to a second logic state based on the output of the second input buffer, and
  assert an enable signal in response to the detection of the transition
a gating logic block configured to receive the asserted enable signal and the output of the first differential input buffer, the gating logic block being further configured to un-gate the output of the first differential input buffer in response to receiving the asserted enable signal.

17. The circuit of claim 16, further comprising a data buffer configured to receive a data signal including a burst of data bits, wherein the first differential input buffer is configured to receive a burst of clock edges in the differential strobe signal after the output of the differential input buffer is un-gated, and wherein the data signal is received approximately commensurately in parallel with the burst of clock edges in the differential strobe signal.

18. The circuit of claim 17, further comprising:
  a delay block configured to delay the output of the un-gated first differential input buffer to align each clock edge in the burst of clock edges with an approximate center of a corresponding one of the data bits in the data signal; and
  a latching circuit configured to sample the data bits in the data signal based on the aligned clock edges.

19. The circuit of claim 16, wherein, after a number of clock edges in the differential strobe signal are received, the control logic block is configured to de-assert the enable signal.

20. The circuit of claim 19, wherein, in response to the de-assertion of the enable signal, the gating logic block is configured to gate the output of the first differential input buffer.

21. The circuit of claim 18 wherein the data signal is a double data rate DQ signal and the differential strobe signal is a DQS signal, and wherein two data bits in the DQ signal are sampled for each clock cycle of the DQS signal, a first of the two data bits being sampled at a rising edge of the clock cycle and a second of the two data bits being sampled at a falling clock edge of the clock cycle.

22. The circuit of claim 21, wherein the circuit is located within a receiving circuit of a controller, and wherein the pseudo open drain output buffer is an output buffer of a DDR4 SDRAM memory device.

23. The circuit of claim 16, wherein the circuit is implemented within a programmable logic device.

* * * * *